US012022579B2

(12) United States Patent
Kim et al.

(10) Patent No.: US 12,022,579 B2
(45) Date of Patent: Jun. 25, 2024

(54) REFLECTOR AND LIGHT SINTERING APPARATUS COMPRISING THE SAME

(71) Applicant: IUCF-HYU (INDUSTRY-UNIVERSITY COOPERATION FOUNDATION HANYANG UNIVERSITY), Seoul (KR)

(72) Inventors: Hak-Sung Kim, Seoul (KR); Chung Hyeon Ryu, Jinju-si (KR); Yong Rae Jang, Ansan-si (KR); Ji Hyeon Chu, Seoul (KR); Jong Whi Park, Seoul (KR); Chang Jin Moon, Seoul (KR)

(73) Assignee: IUCF-HYU (INDUSTRY-UNIVERSITY COOPERATION FOUNDATION HANYANG UNIVERSITY), Seoul (KR)

(*) Notice: Subject to any disclaimer, the term of this patent is extended or adjusted under 35 U.S.C. 154(b) by 919 days.

(21) Appl. No.: 17/025,442

(22) Filed: Sep. 18, 2020

(65) Prior Publication Data
US 2021/0007182 A1    Jan. 7, 2021

Related U.S. Application Data

(63) Continuation of application No. PCT/KR2019/003375, filed on Mar. 22, 2019.

(30) Foreign Application Priority Data

Mar. 23, 2018  (KR) .................. 10-2018-0034122
Mar. 14, 2019  (KR) .................. 10-2019-0029224

(51) Int. Cl.
*H05B 3/00*     (2006.01)
*G02B 5/10*     (2006.01)
*G02B 7/18*     (2021.01)

(52) U.S. Cl.
CPC ............ *H05B 3/0033* (2013.01); *G02B 5/10* (2013.01); *G02B 7/1815* (2013.01)

(58) Field of Classification Search
CPC ....... G02B 5/10; G02B 7/1815; F21V 29/505; F21V 29/10
(Continued)

(56) References Cited

U.S. PATENT DOCUMENTS 7,964,858 B2 *   6/2011  Yang .................. B82Y 10/00
                                            362/345

FOREIGN PATENT DOCUMENTS

CN          201796857 U      4/2011
EP             0146998  *    7/1985  .............. B41F 15/12
(Continued)

OTHER PUBLICATIONS

Machine Translation of KR20180064003A (Year: 2023).*
(Continued)

*Primary Examiner* — Nathaniel E Wiehe
*Assistant Examiner* — Thomas J Ward
(74) *Attorney, Agent, or Firm* — Sughrue Mion, PLLC

(57) ABSTRACT

Provided is a reflector comprising: an outer wall; and an inner wall which reflects the xenon lamp light from a xenon lamp toward an object to be light sintered, and which consists of inner side walls and an inner top wall which are spaced apart by a predetermined distance from the outer wall to allow cooling water for cooling heat generated by the xenon lamp light to flow, wherein at least a part of the inner side walls has the same thickness as at least a part of the inner top wall.

12 Claims, 10 Drawing Sheets

(58) Field of Classification Search
USPC .......................................................... 219/76.1
See application file for complete search history.

(56) References Cited

FOREIGN PATENT DOCUMENTS

| EP | 0146998 | A1 | | 7/1985 | | |
|----|---------|----|---|---------|---|---|
| EP | 0246100 | A2 | | 11/1987 | | |
| EP | 0246100 | A3 | | 3/1989 | | |
| GB | 2169391 | A | | 7/1986 | | |
| GB | 2349684 | A | | 11/2000 | | |
| JP | 2006-043641 | A | | 2/2006 | | |
| JP | 2008-235678 | A | | 10/2008 | | |
| KR | 97-011204 | B1 | | 7/1997 | | |
| KR | 10-0724132 | B1 | | 5/2007 | | |
| KR | 10-0952618 | B1 | | 4/2010 | | |
| KR | 10-1411842 | B1 | | 6/2014 | | |
| KR | 20180064003 | A | * | 12/2016 | .............. | B41F 15/12 |
| KR | 10-1712314 | B1 | | 3/2017 | | |
| KR | 10-2017-0036954 | A | | 4/2017 | | |
| KR | 10-2018-0064003 | A | | 6/2018 | | |

OTHER PUBLICATIONS

Machine Translation of EP0146998 (Year: 2023).*
International Search Report of PCT/KR2019/003375 dated Jun. 24, 2019 [PCT/ISA/210].

* cited by examiner

[Fig. 1]
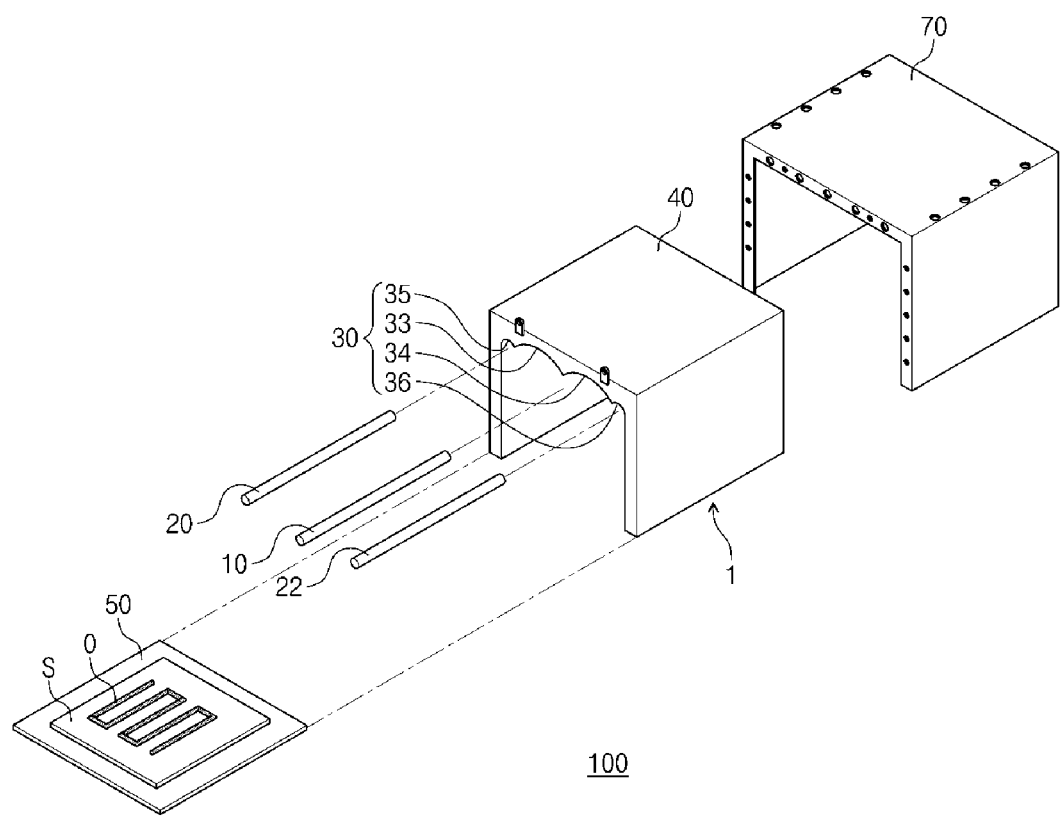

[Fig. 2]
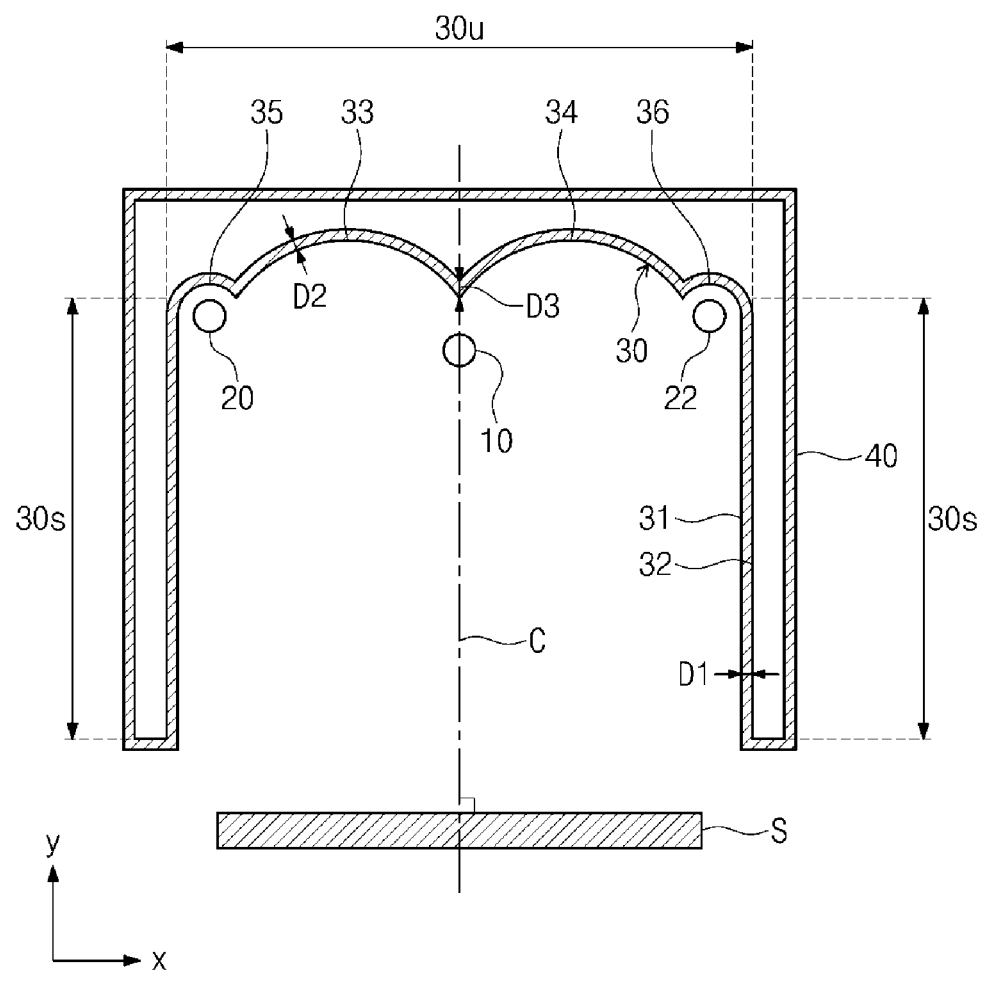

[Fig. 3]
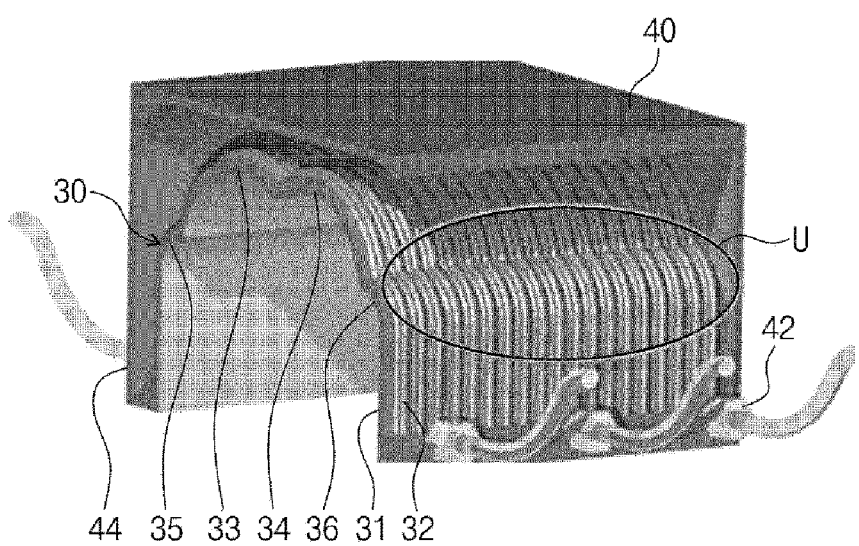

[Fig. 4]
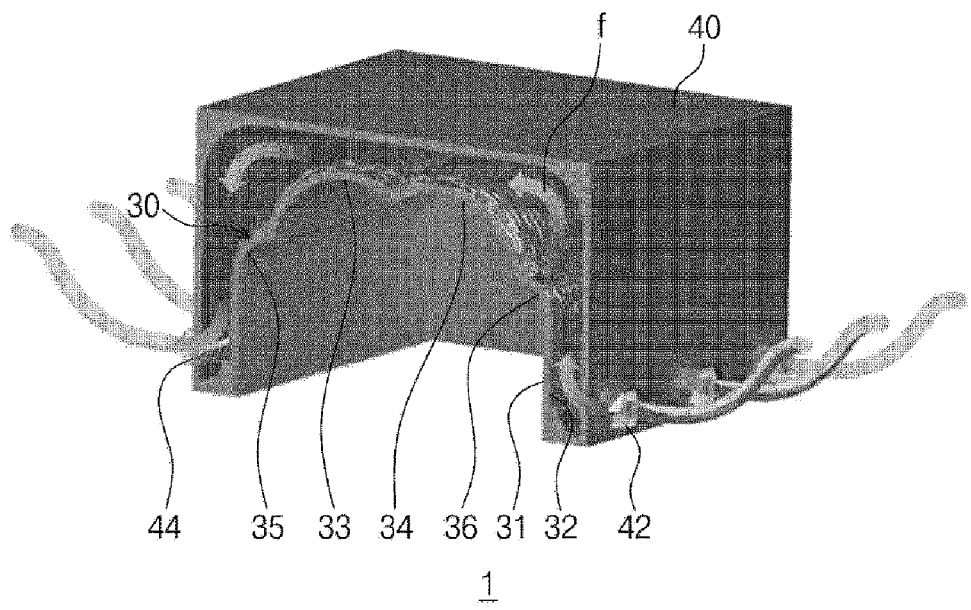

[Fig. 5]
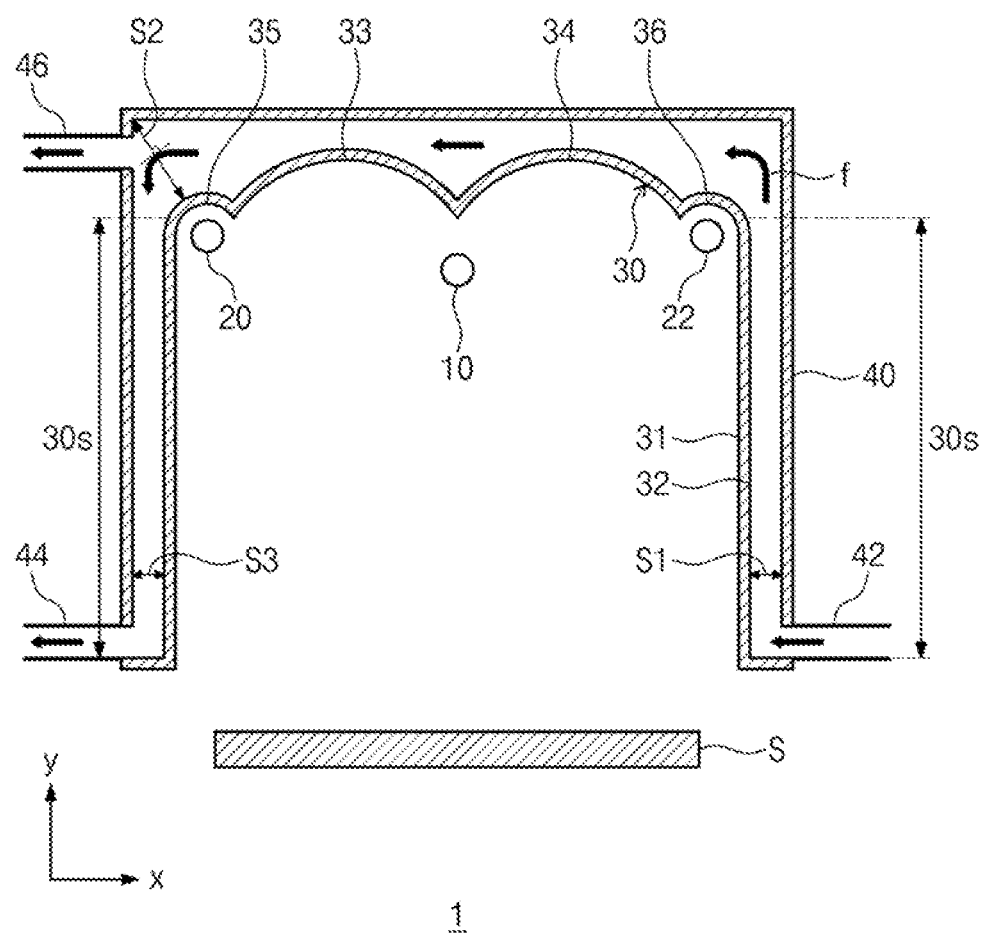

[Fig. 6]
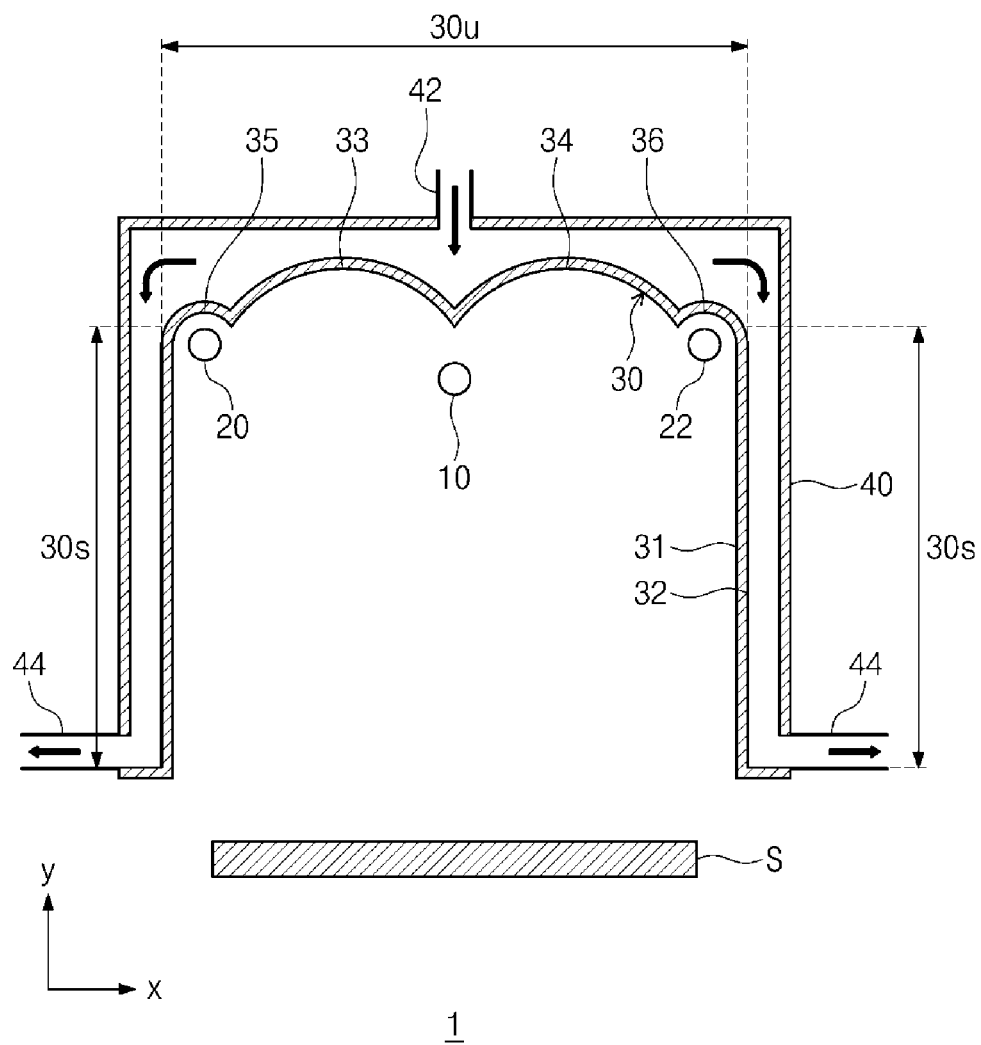

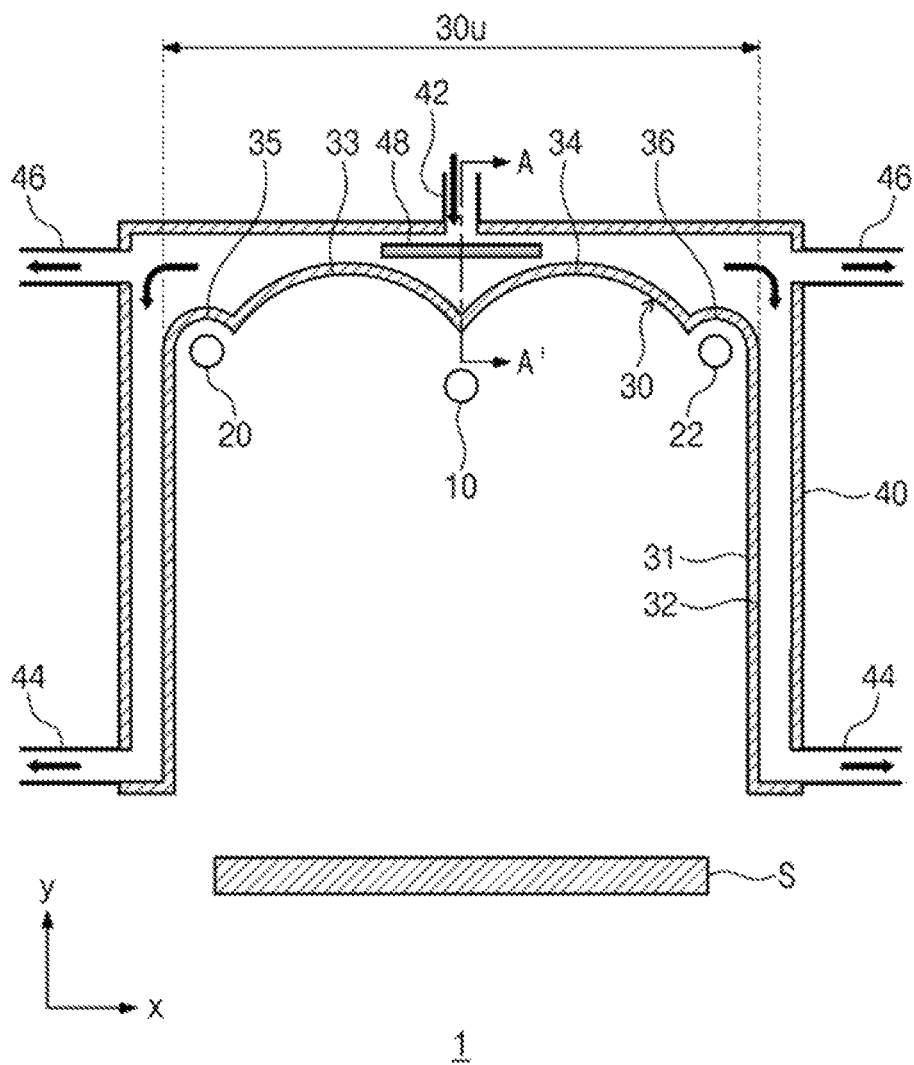
【Fig. 7】

[Fig. 8]
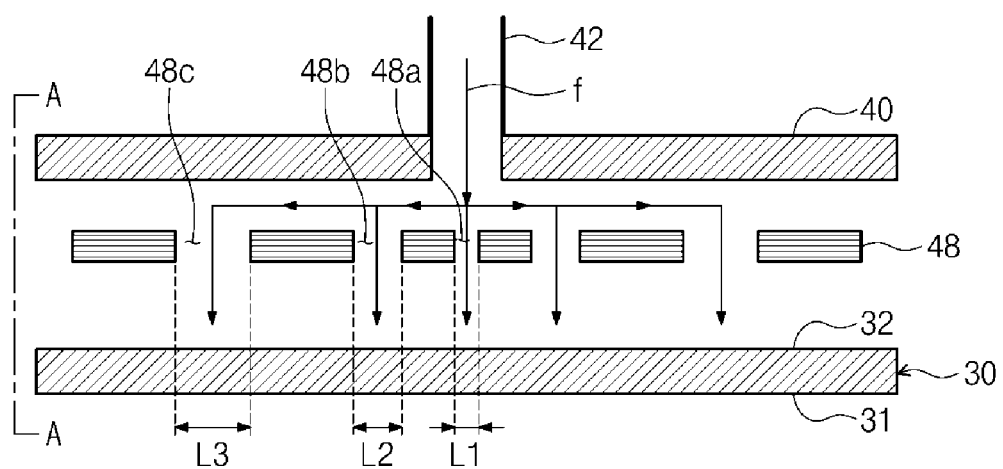

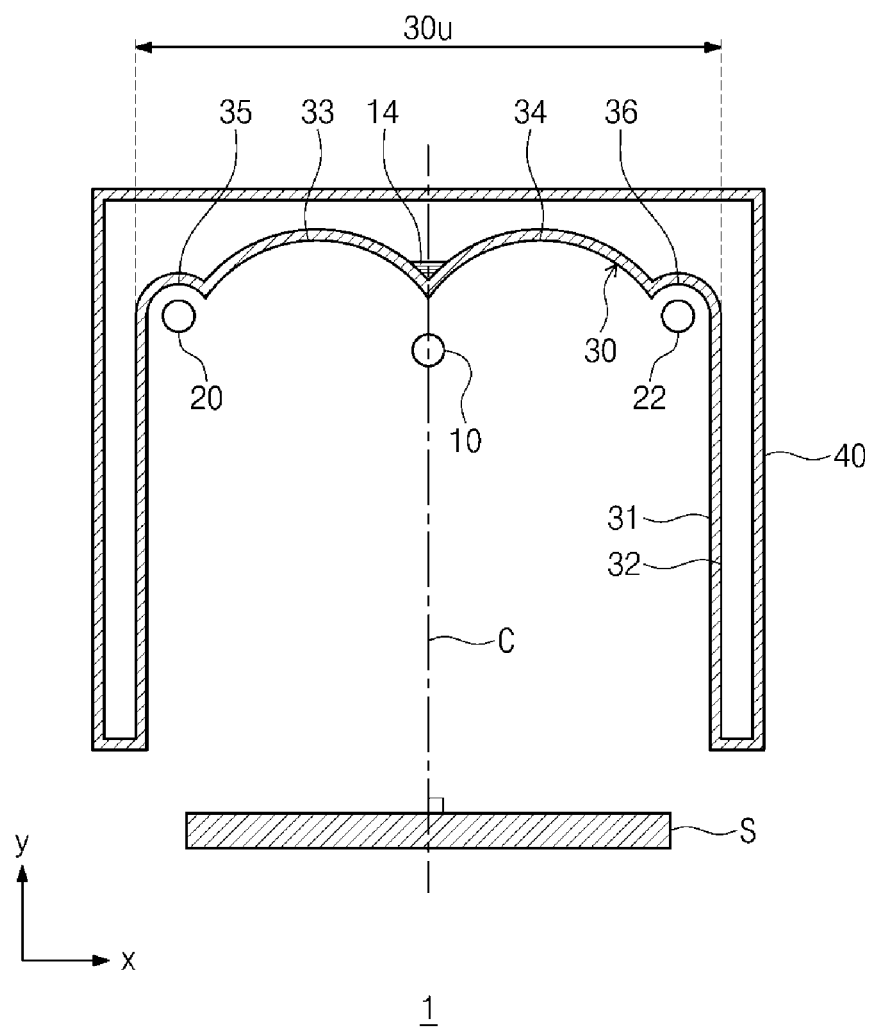
[Fig. 9]

[Fig. 10]
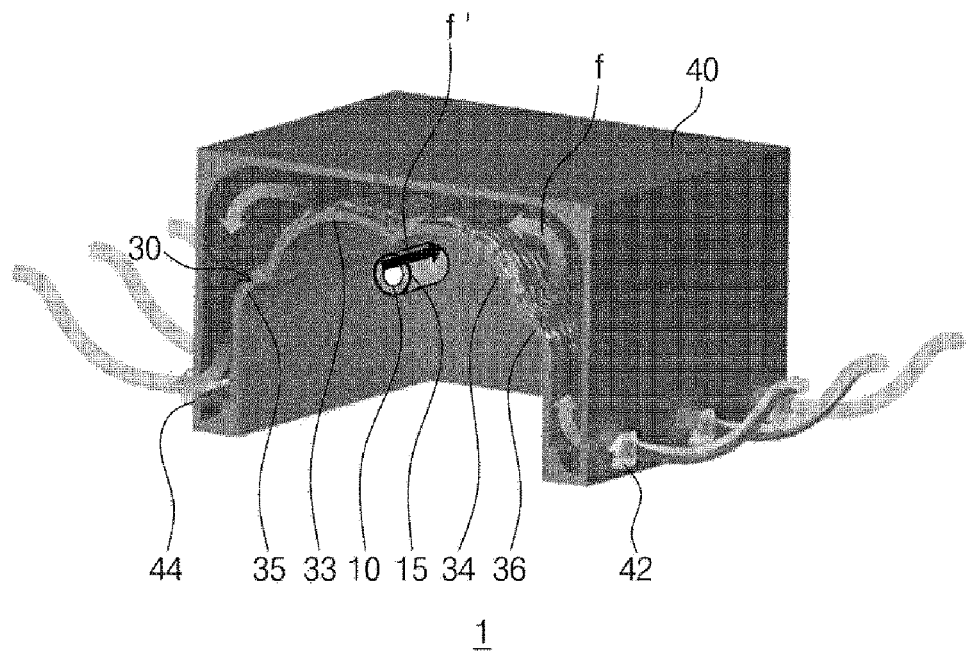

REFLECTOR AND LIGHT SINTERING APPARATUS COMPRISING THE SAME

TECHNICAL FIELD

The present invention relates to a reflector and a light sintering apparatus including the same, and more particularly, to a reflector having a cooling hollow and a light sintering apparatus including the same.

BACKGROUND ART

Recently, as electronic technology and information communication technology have developed, various electronic devices such as smart devices, OLEDs, and solar cells have been developed. A printed electronic technology is utilized to manufacture electronic elements used in the above electronic devices.

The printed electronic technology refers to a technology that manufactures electronic elements having desired functions by printing functional ink having conductivity, insulation property, and semiconductor property onto plastic, film, paper, glass, and substrate through industrial printing process techniques. The above printed electronic technology is applicable by printing on various materials, and enables mass production, large area, and process simplification through a manufacturing process different from the existing electronics industry.

The process of the printing electronics includes three steps of printing, drying, and sintering. The sintering process is a step that significantly exerts an effect on product performance. The sintering signifies to make a functional thin film in a solid form by dissolving nanoparticles, which is a process having a considerable value in the next generation technology fields.

Accordingly, in the related art, researches on light sintering apparatuses for performing a sintering process have been actively conducted.

For example, Korean Unexamined Patent Publication No. 20170129429A discloses a light sintering apparatus including a lamp housing, a pulse lamp provided inside the lamp housing and filled with filling gas therein to generate light when power is supplied, pulse control units connected to both ends of the pulse lamp and configured to control the power of the pulse lamp so that light of a pulse wave is generated in the pulse lamp, a reflector provided inside the lamp housing to reflect the light generated by the pulse lamp, and a light condensing unit that collects the light generated by the pulse lamp and the light reflected by the reflector to condense the light in a set region.

However, the conventional light sintering apparatus rarely provides a reflector that uniformly reflects light emitted from a lamp to an object to be light-sintered. This is because it is difficult to uniformly cool the reflector in the conventional light sintering apparatus.

Accordingly, a reflector and a light sintering apparatus including the same are required to supply a heat source for light sintering to the object to be light-sintered, and easily block a generation of unnecessary heat other than the supplied heat source.

DISCLOSURE

Technical Problem

One technical problem to be solved by the present invention is to provide a reflector for allowing cooling water to flow through a cooling hollow defined by separation between an inner wall and an outer wall.

Another technical problem to be solved by the present invention is to provide a reflector for cooling both of inner side walls and an inner top wall.

Still another technical problem to be solved by the present invention is to provide a reflector including a first main curved portion and a second main curved portion.

Still another technical problem to be solved by the present invention is to provide a reflector for fast and uniformly dissipating heat generated by light emitted from a xenon lamp and a far infrared lamp.

Still another technical problem to be solved by the present invention is to provide a reflector lighter than a conventional reflector.

Still another technical problem to be solved by the present invention is to provide a reflector including at least one cooling water inlet formed in an outer wall facing one side of an inner side wall to introduce cooling water, and at least one cooling water outlet formed in the outer wall facing the other side of the inner side wall to discharge the cooling water.

Still another technical problem to be solved by the present invention is to provide a reflector including at least one cooling water inlet formed in an outer wall facing a top side of an inner top wall to introduce cooling water and at least one cooling water outlet formed in an outer wall facing one side of an inner side wall to discharge the cooling water.

Still another technical problem to be solved by the present invention is to provide a reflector including a spray plate having a plurality of spray ports.

Still another technical problem to be solved by the present invention is to provide a reflector provided with a heat transfer pad for filling a valley between upwardly convex sites from a vertically upward site from a xenon lamp.

Still another technical problem to be solved by the present invention is to provide a reflector including a cooling tube on which cooling water flows while surrounding a xenon lamp.

The technical problems to be solved by the present invention are not limited to the above.

Technical Solution

In order to solve the above-mentioned technical problems, the present invention provides a reflector.

According to one embodiment, the reflector includes an outer wall, and an inner wall configured to reflect xenon lamp light from a xenon lamp toward an object to be light sintered, and include inner side walls and an inner top wall which are spaced apart from the outer wall by a predetermined distance so as to allow cooling water for cooling heat generated by the xenon lamp light to flow, wherein at least a part of the inner side walls may have the same thickness as at least a part of the inner top wall.

According to one embodiment, the cooling water may cool all of the inner side walls and the inner top wall.

According to one embodiment, the inner top wall may include a first main curved portion arranged in an upper left of a position provided with the xenon lamp and upwardly convex toward the outer wall, and a second main curved portion symmetrical to the first main curved portion rightward around a position provided with the xenon lamp and upwardly convex toward the outer wall.

According to one embodiment, the inner top wall includes a reflective surface that reflects the xenon lamp light from the xenon lamp toward the object to be light sintered, and a cooling surface that provides a surface on which the cooling water flows, wherein the reflective surface may have a shape upwardly convex to both sides from a vertical upward site from the xenon lamp, and the cooling surface may have a shape corresponding to the shape of the reflective surface.

According to one embodiment, the shape of the cooling surface corresponds to the shape of the reflective surface upwardly convex to both sides, so that the weight due to the cooling water may be supported by the upward convex shape of the cooling surface.

According to one embodiment, the cooling surface may have a concavo-convex structure extending from an inlet for introducing the cooling water to an outlet for discharging the cooling water.

One embodiment may further include at least one cooling water inlet formed in the outer wall facing one side of the inner side wall to introduce cooling water, and at least one cooling water outlet formed in the outer wall facing the other side of the inner side wall to discharge the cooling water, and may further include an additional cooling water outlet provided in the outer wall of a region having a cooling passage area larger than a cooling passage area on a cooling water inlet side or a cooling passage area on a cooling water outlet side One embodiment may further include at least one cooling water inlet formed in the outer wall facing a top side of the inner top wall to introduce cooling water and at least one cooling water outlet formed in the outer wall facing one side of the inner side wall to discharge the cooling water, and may further include an additional cooling water outlet provided in the outer wall of a region having a cooling passage area larger than a cooling passage area on a cooling water inlet side or a cooling passage area on a cooling water outlet side One embodiment may further include at least one cooling water inlet formed in the outer wall facing a top side of the inner top wall to introduce cooling water, and a spray plate extending in a lengthwise direction of the xenon lamp, and the spray plate may include a plurality of spray ports, in which the spray ports may have openings gradually larger in size when being far from the cooling water inlet.

According to one embodiment, the cooling surface may be provided with a heat transfer pad for filling a valley between upwardly convex sites from a vertically upward site from the xenon lamp.

One embodiment may further include a cooling tube on which cooling water flows while surrounding a xenon lamp, wherein the direction of the cooling water flowing through the cooling tube and the direction of the cooling water flowing in a space between the outer wall and the inner wall may be different from each other.

In order to solve the above-mentioned technical problems, the present invention provides a light sintering apparatus.

According to one embodiment, the light sintering apparatus includes a xenon lamp; and a reflector having an outer wall, and an inner wall reflecting xenon lamp light from the xenon lamp toward an object to be light sintered, and including inner side walls and an inner top wall which are spaced apart from the outer wall by a predetermined distance so as to allow cooling water for cooling heat generated by the xenon lamp light to flow.

According to one embodiment, at least a part of the inner side walls of the reflector may have the same thickness as at least a part of the inner top wall.

Advantageous Effects

According to the embodiment of the present invention, a reflector and a light sintering apparatus including the same may be provided, in which the reflector includes an outer wall, and an inner wall reflecting xenon lamp light from a xenon lamp toward an object to be light sintered, and including inner side walls and an inner top wall which are spaced apart from the outer wall by a predetermined distance so as to allow cooling water for cooling heat generated by the xenon lamp light to flow, wherein at least a part of the inner side walls has the same thickness as at least a part of the inner top wall.

Accordingly, the inner side walls as well as the inner top wall of the reflector can be uniformly cooled.

In addition, the reflector includes an inner wall including inner side walls and an inner top wall which are spaced apart from the outer wall by a predetermined distance, that is, a cooling hollow, so that the weigh can be reduced.

In addition, the inner top wall of the reflector is formed in a curved shape, so that the weight of the cooling water provided in the cooling hollow can be supported.

DESCRIPTION OF DRAWINGS

FIG. 1 is a view for explaining a light sintering apparatus according to the embodiment of the present invention.

FIG. 2 is a view for explaining a reflector according to the embodiment of the present invention.

FIG. 3 is a view for explaining a cooling surface of the reflector according to the embodiment of the present invention.

FIG. 4 is a view showing cooling water flowing in the reflector according to the embodiment of the present invention.

FIG. 5 shows a first modification of the reflector according to the embodiment of the present invention.

FIG. 6 shows a second modification of the reflector according to the embodiment of the present invention.

FIGS. 7 and 8 show a third modification of the reflector according to the embodiment of the present invention.

FIG. 9 shows a fourth modification of the reflector according to the embodiment of the present invention.

FIG. 10 shows a fifth modification of the reflector according to the embodiment of the present invention.

BEST MODE

Hereinafter, exemplary embodiments of the present invention will be described in detail with reference to the accompanying drawings. However, the technical idea of the present invention is not limited to the exemplary embodiments described herein and may be embodied in other forms. Further, the embodiments disclosed thoroughly and completely herein may be provided such that the idea of the present invention can be fully understood by those skilled in the art.

In the specification herein, when one component is mentioned as being on another component, it signifies that the one component may be placed directly on another component or a third component may be interposed therebetween. In addition, in drawings, the shape and the thicknesses of regions may be exaggerated to effectively describe the technology of the present invention.

In addition, although terms such as first, second and third are used to describe various components in various embodiments of the present specification, the components should not be limited by the terms. The above terms are used merely to distinguish one component from another. Accordingly, a first component referred to in one embodiment may be referred to as a second component in another embodiment.

Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it should be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the present specification, the expressions "identical", "vertical", or "symmetrical" include not only being completely identical, vertical, or symmetrical, but also include being substantially identical, vertical, or symmetrical. Further, in the present specification, the expressions "identical", "vertical", or "symmetrical" include not only being identical, vertical, or symmetrical on a design value, but also include being identical, vertical, or symmetrical on a product.

Further, in the following description of the embodiments of the present invention, the detailed description of known functions and configurations incorporated herein will be omitted when it possibly makes the subject matter of the present invention unclear unnecessarily.

FIG. 1 is a view for explaining a light sintering apparatus according to the embodiment of the present invention.

Referring to FIG. 1, the light sintering apparatus 100 according to one embodiment of the present invention may include a reflector 1, a housing 70, and a support 50. In addition, a xenon lamp 10 and a lamp, such as a far infrared lamp, that may assist a sintering process may be provided at one side of the reflector 1 of the light sintering apparatus 100. Hereinafter, each configuration will be described in detail.

The xenon lamp 10 is a lamp that emits light by electric discharge occurring in xenon gas, and may sinter an object 0 to be light sintered by generating extreme white light having a light spectrum of wavelengths between 60 nm and 2.5 mm.

The object 0 to be light sintered, such as fine metal particles and precursors patterned on s substrate S or the like, may signify an object material to be light sintered. For example, the object 0 to be light sintered may include metal such as copper, iron, molybdenum, nickel, aluminum, gold and platinum, as well as ceramic such as titanium oxide, lithium cobalt oxide, and silicon oxide. The object 0 to be light sintered may have a nano or micro size. In this case, the surface area ratio of particles becomes large, so that a high light absorption may be provided. In addition, for example, the object 0 to be light sintered, as metal nano ink printed on the substrate S, may be formed as an electrode of an electronic apparatus, such as a solar cell, a semiconductor, or a display, after drying and sintering steps. However, the object 0 may not be limited to the metal nano ink for forming the electrode. The substrate S may be plastic, film, paper, glass, or the like.

The far infrared lamp may improve the efficiency of sintering because ultraviolet light cuts off links that connect polymers contained in the ink when the object 0 is metal nano ink. In addition, the far infrared lamp may perform a function to dry the object 0. To this end, as shown in FIG. 1, a first far infrared lamp 20 and a second far infrared lamp 22 may be provided.

The reflector 1 may reflect light emitted from the xenon lamp 10, the first far infrared lamp 20, and the second far infrared lamp 22 in a direction toward a top surface of the object 0 of the substrate S.

In addition, the reflector 1 may be heated by xenon lamp light emitted from the xenon lamp 10, so a cooling passage may be provided in the reflector 1.

According to one embodiment of the present invention, the reflector 1 may be manufactured by using any one or mixing at least two among various metals, such as gold, silver, aluminum, and iron, and non-metal materials such as ceramic and alumina. The material of the reflector 1 itself may not be limited to the above-described materials. Any one or a mixture of at least two of the above-described materials may be provided to be coated on the reflective surface 31 of the reflector 1.

In addition, the light sintering apparatus 100 according to one embodiment of the present invention may include a housing 70 positioned outside the reflector 1. The housing 70 may cover the reflector 1. The housing 70 may surround an outside of the reflector 1, that is, an outer surface of an outer wall 40. Accordingly, the housing 70 may protect the reflector 1 from an external environment. Specifically, the housing 70 may protect the reflector 1 from an external impact.

Further, the light sintering apparatus 100 according to one embodiment of the present invention may further include a support 50 for fixing the substrate S on which the object 0 is printed. The support 50 may fixedly dispose the substrate S. Specifically, the support 50 may dispose the substrate S so as to be spaced downward by a predetermined distance from an end of the reflector 1, that is, the lowermost of the reflector 1. For example, the support 50 may be fixed while the substrate S on which the object 0 is printed undergoes a process of sintering, or may function as a movable fixture such that the substrate S on which the object 0 is printed is sintered while moving in a roll-to-roll manner.

Hereinafter, the reflector according to the embodiments of the present invention will be described in detail with reference to FIGS. 2 to 10.

FIG. 2 is a view for explaining the reflector according to the embodiment of the present invention. FIG. 3 is a view for explaining the cooling surface according to the embodiment of the present invention. FIG. 4 is a view showing cooling water flowing in the reflector according to the embodiment of the present invention.

The reflector 1 may reflect the light emitted from the xenon lamp 10, the first far infrared lamp 20, and the second far infrared lamp 22 from the xenon lamp 10 toward the object 0 on the substrate S, and may easily cool heat generated by the light emitted from the lamps 10, 20 and 22.

As shown in FIG. 2, in order to cool the heat by the light emitted from the lamps 10, 20 and 22, especially the xenon lamp 10, the reflector 1 may include an inner wall 30, and an outer wall 40 spaced apart from the inner wall 30 at a predetermined distance. Specifically, the inner wall 30 of the reflector 1 may include inner side walls 30s provided on both sides thereof, and an inner top wall 30u provided between the inner side walls 30s provided on the both sides.

Accordingly, a space between the inner wall 30 and the outer wall 40 may provide a cooling hollow through which cooling water flows. Specifically, the cooling water may flow along a space between the inner side walls 30s and the outer wall 40, and a space between the inner top wall 30u and the outer wall 40. In other words, when the cooling water flows in the cooling hollow of the reflector 1, all of the inner side walls 30s and the inner top wall 30u may be cooled. Accordingly, the reflector 1 may easily cool the heat generated by the light emitted from the lamps 10, 20 and 22.

The inner top wall 30u of the reflector 1 may include a first main curved portion 33, a second main curved portion 34, a first auxiliary curved portion 35, and a second auxiliary curved portion 36. These are configured to uniformly provide the light of the xenon lamp 10 onto the substrate S. Hereinafter, the inner top wall 30u will be described in detail.

According to one embodiment, the first main curved portion 33 may be arranged on an upper left side of a position provided with the xenon lamp 10, and may be convex upward (+y direction) toward the outer wall 40. Accordingly, the first main curved portion 33 may reflect the light emitted from the xenon lamp 10 to the substrate S. In addition, the first main curved portion 33 may be symmetrical with respect to the highest point of the first main curved portion 33.

According to one embodiment, the second main curved portion 34 may be symmetrical to the first main curved portion 33 rightward around a position provided with the xenon lamp 10, and may be convex upward (+y direction) toward the outer wall 40. Accordingly, the second main curved portion 34 may reflect the light emitted from the xenon lamp 10 to the substrate S. In addition, the second main curved portion 34 may be symmetrical with respect to the highest point of the second main curved portion 34.

A chord of the first main curved portion 33 and a chord of the second main curved portion 34 may be positioned on the same line. In addition, a right end of the first main curved portion 33 and a left end of the second main curved portion 34 may form a contact point, and a line c extending from the contact point to a center of a section of the xenon lamp 10 in a longitudinal direction (hereinafter referred to as a center line) may be perpendicular to the substrate S.

In addition, as shown in FIG. 2, the inner top 30u may further include a first auxiliary curved portion 35 and a second auxiliary curved portion 36 to improve the uniformity of the first and second far infrared lamps 20 and 22 directed to the substrate S.

The first and second auxiliary curved portions 35 and 36 are recessed concave upward from a lower surface of the inner top wall 30u, thereby having a curved shape like the first and second main curved portions 33 and 34, in which one ends may come into contact with the other ends of the first and second main curved portions 33 and 34, respectively. Specifically, the first auxiliary curved portion 35 may extend to be upwardly convex from a left end of the first main curved portion 33, and the second auxiliary curved portion 36 may extend to upwardly convex from a right end of the second main curved portion 34.

According to one embodiment, the first main curved portion 33 and the first auxiliary curved portion 35 may be symmetrical with the second main curved portion 34 and the second auxiliary curved portion 36 about the center line c.

The first far infrared lamp 20 and the second far infrared lamp 22 may be positioned below curved points of the first auxiliary curved portion 35 and the second auxiliary curved portion 36, respectively. The first auxiliary curved portion 35 may be positioned to surround at least a part of the first far infrared lamp 20, and the second auxiliary curved portion 36 may be positioned to surround at least a part of the second far infrared lamp 20.

The first far infrared lamp 20 and the second far infrared lamp 22 positioned below the first auxiliary curved portion 35 and the second auxiliary curved portion 36, respectively, may be symmetrical with each other about the center line c.

According to one embodiment, the first far infrared lamp 20 and the second far infrared lamp 22 may be positioned above the xenon lamp 10 in a +y direction.

Meanwhile, according to the embodiment of the present invention, the inner wall 30 may have a reflective surface 31 and a cooling surface 32. The reflective surface 31 may reflect xenon lamp 10 light from the xenon lamp 10 and first and second far infrared lamps 20 and 22 light from the first and second far infrared lamps 20 and 22 in a direction toward the substrate S, and the cooling surface 32 may provide a surface through which the cooling water flows.

The reflective surface 31 of the inner top wall 30u may be formed along the shapes of the main curved portion and the auxiliary curved portion, which are the shapes of the above-described inner top wall 30u.

In addition, the reflective surface 31 of the inner side wall 30s may have a shape extending along a Y axis.

Meanwhile, the shape of the cooling surface 32 may correspond to the shape of the reflective surface 31. Accordingly, at least a part of the inner side walls 30s may have the same thickness as at least a part of the inner top wall 30u. For example, a thickness D1 of at least a part of the inner side wall 30s may be the same as a thicknesses D2 and D3 of at least a part of the inner top wall 30u.

As shown in FIG. 2, the D2 will be regarded as a thickness of a site upwardly convex from both sides from a site vertically upward from the xenon lamp 10 in the inner top wall 30u, and the D3 will be regarded as a thickness of a valley between sites upwardly convex to both sides from the site vertically upward from the xenon lamp 10 in the inner top wall 30u.

Since the thickness D1 of at least a part of the inner side wall 30s and the thickness D2 and D3 of at least a part of the inner top wall 30u are the same as each other, the reflector 1 may uniformly cool the inner side wall 30s and the inner top wall 30u heated by the light emitted from the xenon lamp 10 by using the cooling water.

Accordingly, the reflector 1 may quickly and uniformly dissipate the heat generated by the light of the xenon lamp 10.

Hereinafter, a cooling structure and a principle of the reflector 1 including the reflective surface 31 and the cooling surface 32 will be described in detail with reference to FIGS. 3 and 4.

Referring to FIGS. 3 and 4, the cooling surface 32 of the reflector 1 may have a concave-convex structure U extending from the cooling water inlet 42 for introducing the cooling water to the cooling water outlet 44 for discharging the cooling water.

The cooling surface 32 of the reflector 1 according to the embodiments of the present invention may include the concavo-convex structure U. A surface area of the cooling surface 32 increases due to the concavo-convex structure U, and thus the cooling surface 32 may be rapidly cooled.

Accordingly, the reflector 1 of the light sintering apparatus 100 supplies a heat source for light sintering to an object 0 to be light sintered on the substrate S, and easily blocks unnecessary heat generation other than the supplied heat source, so that an optimal light sintering environment may be provided to the object 0 to be light sintered.

In addition, referring to FIGS. 3 and 4, the cooling surface 32 may have a shape corresponding to the shape of the reflective surface 31 upwardly convex to the both sides, as described above. Due to the shape of the upward convex cooling surface 32, the cooling surface 32 may support the weight of the flowing cooling water.

Meanwhile, according to the embodiment of the present invention, the reflector 1 may be provided with the cooling water inlet 42 and the cooling water outlet 44 to control a flow of the cooling water in the cooling hollow. For example, the cooling water inlet 42 may be provided in one side of a cooling hollow defined by one inner side wall 30s, and the cooling water outlet 44 may be provided in one side of a cooling hollow defined by the other the inner side wall 30s. Accordingly, as shown in FIG. 4, the cooling water may sequentially flow (f) through the one inner side wall 30s, the inner top wall 30u, and the other inner side wall 30s.

Hereinafter, the cooling water inlet 42 and the cooling water outlet 44, and the flow f of the cooling water controlled according to the cooling water inlet and outlet 42 and 44 will be described in detail with reference to FIGS. 5 and 6 according to the embodiments of the present invention.

FIG. 5 shows a first modification of the reflector according to the embodiment of the present invention.

Referring to FIG. 5 to describe the first modification of the present invention, the reflector 1 may include at least one cooling water inlet 42, at least one cooling water outlet 44, and an additional cooling water outlet 46.

The cooling water inlet 42 may be formed in the outer wall 40 facing one side of the inner side wall 30s and the cooling water may be introduced thereto. The cooling water outlet 44 may be formed in the outer wall 40 facing the other side of the inner side wall 30s and the cooling water introduced into the cooling water inlet 42 may be discharged to the cooling water outlet 44.

In addition, the additional cooling water outlet 46 may be provided in the outer wall 40 of a region having a cooling passage area S2 larger than a cooling passage area S1 on a cooling water inlet 42 side or a cooling passage area S3 on a cooling water outlet 44 side.

The cooling passage area refers to an area of a section perpendicular to a flowing direction of the cooling water.

According to the embodiment of the present invention, the additional cooling water outlet 46 is provided in the outer wall 40 of the region having the cooling passage area S2 larger than the cooling passage area S1 on the cooling water inlet 42 side or the cooling passage area S3 on the cooling water outlet 44 side, so that the flow f of the cooling water may be easily controlled.

Specifically, when the cooling water introduced through the cooling water inlet 42 passes through the cooling passage area S1 and reaches the cooling passage area S2 larger than the cooling passage area S1, the flow rate of the cooling water may be slower.

In other words, the additional cooling water outlet 46 is provided in the region where the cooling passage area S2 is greater, so that the flow rate of the cooling water may be reduced.

FIG. 6 shows a second modification of the reflector according to the embodiment of the present invention.

According to the second modification of the invention, as shown in FIG. 6, the reflector 1 may include at least one cooling water inlet 42, and at least one cooling water outlet 44.

The cooling water inlet 42 may be formed in the outer wall 40 facing a top side of the inner top wall 30u and the cooling water may be introduced thereto. At least one cooling water outlet 44 may be formed in the outer wall 40 facing one side of the inner side wall 30s and the cooling water introduced into the cooling water inlet 42 may be discharged to the cooling water outlet 44.

Specifically, the cooling water inlet 42 may be provided in the inner top wall 30u on the line extending from the site vertically upward from the xenon lamp 10. In other words, the cooling water inlet 42 may be provided in the inner top 30u on the line extending vertically upward from the center of the valley between the sites upwardly convex to the both sides.

In addition, the cooling water outlet 44 may be provided in both sides of the inner side walls 30s symmetrical laterally about a site vertically downward from the cooling water inlet 42.

Accordingly, the reflector 1 may easily control the flow f of the cooling water in the cooling hollow. In other words, the cooling water inlet 42 may be formed at a site vertically upward to the valley between the sites upwardly convex to the both sides, and the cooling water outlet 44 may be formed at sites symmetrical laterally with respect to the cooling water inlet 42.

Accordingly, the cooling water introduced through the cooling water inlet 42 may move through the symmetrical passages on the both sides while being discharged through the cooling water outlets 44 on both sides.

Accordingly, the uniform cooling velocity may be maintained until the cooling water introduced into the cooling water inlet 42 is discharged to the cooling water outlets 44 on the both sides, through the symmetric paths of the reflector 1. Accordingly, the inner side walls 30s on the both sides may be uniformly cooled.

In addition, since the xenon lamp 10 as a largest heat source is cooled first, the cooling is efficiently performed.

According to one embodiment of the present invention, even when the cooling water inlet 42 is formed at the site vertically upward to the valley between the sites upwardly convex to the both sides, and the cooling water outlet 44 is formed at the sites symmetrical laterally with respect to the cooling water inlet 42, the reflector 1 may further include an additional cooling water outlet 46. In other words, the additional cooling water outlet 46 may be provided in the outer wall of the region having the cooling passage area larger than the cooling passage area on the cooling water inlet 42 side or the cooling passage area on the cooling water outlet 44 side, so as to facilitate the flow of the cooling water.

From the above aspect, the position of the additional cooling water outlet 46 provided to facilitate the flow of the cooling water is not limited. In other words, when the speed of the cooling water flowing in a part of the reflector 1 is slow, the additional cooling water outlet 46 may be provided at the part.

Accordingly, the speed of the cooling water flowing in the cooling hollow of the reflector 1 may be maintained uniformly. Accordingly, the light emitted from the xenon lamp 10 may be uniformly provided onto the substrate S.

FIGS. 7 and 8 show a third modification of the reflector according to the embodiment of the present invention.

According to the third modification of the invention, the reflector 1 may include a spray plate 48.

Referring to FIG. 7, the spray plate 48 may be provided in a separated space between the xenon lamp 10 and the cooling water inlet 42 formed in the outer wall 40 facing the top side of the inner top wall 30u. Specifically, the spray plate 48 is provided in the separated space, and may extend along the lengthwise direction of the xenon lamp 10.

Referring to FIG. 8 enlarged along line A-A' of FIG. 7 to describe the spray plate 48 in more detail, the spray plate 48 may include a plurality of spray ports 48a, 48b and 48c. The spray ports 48a, 48b and 48c may have openings gradually larger in size when being far from the cooling water inlet 42.

Specifically, the spray port closest to the cooling water inlet 42 will be regarded as 48a, the spray port farther than 48a from the cooling water inlet 42 along the longitudinal direction of the xenon lamp 10 will be regarded as 48b, and the spray port farther than 48b will be regarded as 48c.

In this case, as shown in FIG. 8, the spray ports may have openings of L3, L2 and L1 corresponding to 48c, 48b and 48a and sequentially greater, respectively. In other words, the spray port 48a including the opening having a relatively small size L1 may be formed in a surface of the spray plate 48 close to the cooling water inlet 42, the spray port 48b including the opening having a size L2 greater than 48a may be formed in the surface of the spray plate 48 farther than 48a from the cooling water inlet 42, and the spray port 48c including the opening having a size L3 greater than 48b may be formed in the surface of the spray plate 48 farther than 48b from the cooling water inlet 42.

Accordingly, the cooling water introduced into the cooling water inlet 42 of the outer wall 40 of the reflector 1 may be uniformly provided onto the cooling surface 32 of the inner wall 30 through the spray plate 48. In other words, the sizes of the openings is prepared based on distances between the cooling water inlet 42 and the spray ports 48a, 48b and 48c, so that amounts of the flow f of the cooling water according to the sizes of the openings relative to the distances may be compensated. Accordingly, the cooling water having passed through the spray plate 48 may uniformly cool the cooling surface 32.

FIG. 9 shows a fourth modification of the reflector according to the embodiment of the present invention.

According to the fourth modification of the invention, the reflector 1 may include a heat transfer pad 14.

Referring to FIG. 9, the heat transfer pad 14 may be provided on the cooling surface 32 of the inner top wall 30u. Specifically, the heat transfer pad 14 may fill a valley between upwardly convex sites from a vertically upward site from the xenon lamp 10. In another aspect, the heat transfer pad 14 may be provided in a contact region where the first main curved portion 33 and the second main curved portion 34 come into contact with each other.

In the fourth modification, as in the embodiment described with reference to FIG. 4, the cooling water inlet 42 and the cooling water outlet 44 may be provided.

In this case, the flow rate of the cooling water at the valley may be slower than the flow rate of the cooling water at the site upwardly convex to the both sides. This is because the valley includes a closed space, compared to the site upwardly convex to the both sides. In this case, a temperature in the vicinity of the valley having a relatively slow flow rate may be higher than a temperature of the site upwardly convex to the both sides having a relatively fast flow rate.

Accordingly, unlike the embodiments of the present invention, when the heat transfer pad 14 is not provided at the valley, the reflector cannot be cooled uniformly by the cooling water. Accordingly, the light emitted from the xenon lamp 10 cannot be uniformly provided onto the substrate S.

In addition, the heat transfer pad 14 may serve to fill the valley. Accordingly, the cooling water flowing through the cooling hollow of the reflector 1 may be prevented from being stagnant in the valley.

However, according to the embodiment of the present invention, the reflector 1 may provide the heat transfer pad 14 at the valley such that the temperatures between the valley and the upwardly convex sites to the both sides are uniformly distributed. Accordingly, the reflector 1 may uniformly cool the inner top wall 30u by using the cooling water. Accordingly, the light emitted from the xenon lamp 10 may be uniformly provided onto the substrate S.

It has been assumed that the fourth modification is applied to the embodiment of the present invention. However, the fourth modification may be applied to the first to third modifications.

FIG. 10 shows a fifth modification of the reflector according to the embodiment of the present invention.

According to the fifth modification of the invention, the reflector 1 may include a cooling tube 15. For description of the fifth modification, since the configurations other than the cooling tube 15 is the same as the embodiments described with reference to FIGS. 1 to 4, the detailed description will be omitted.

Referring to FIG. 10, the cooling tube 15 may have a shape for surrounding the xenon lamp 10. The cooling tube 15 may allow the cooling water to flow into the cooling hollow inside the cooling tube 15. Accordingly, the cooling tube 15 may surround and cool the xenon lamp 10 by using the cooling water provided inside the cooling tube 15.

According to one embodiment, a direction of the flow f of the cooling water flowing through the cooling tube 15 may be different from a direction of the flow f of the cooling water flowing in the separated space between the outer wall 40 and the inner wall 30.

Accordingly, the xenon lamp 10 may be cooled in multiple directions.

Herein, the reflector and the light sintering apparatus using the same according to the embodiments of the present invention have been described with reference to FIGS. 1 to 10. As described above, the reflector according to the embodiments of the present invention may include the cooling hollow through which the cooling water flows.

In general, the reflector is heated to have an internal temperature at hundreds of degrees by the xenon lamp. Accordingly, foreign matter sticks to or burns on the reflective surface of the reflector. In this case, since the reflectivity of the reflector is deteriorated by the foreign matter, the uniformity of the light sintering is lowered. Accordingly, the conventional reflector may have the increased temperature after being heated by light emitted from lamps. Accordingly, the high-temperature reflector may be easily contaminated from foreign matter and may cause changes in physical properties such as color variation.

However, according to one embodiment of the present invention, since the reflector is cooled through the cooling hollow, the problems caused by the foreign matter can be solved.

In addition, since the reflector includes the cooling hollow, a collateral effect of being lightweight can be provided.

In addition, since the reflector includes the cooling hollow having the curved shape, the light emitted from the xenon lamp and the far infrared lamp in the direction toward the top surface of the light sintering object can uniformly reach.

The above-described embodiments of the present invention and the modifications thereof may be variously combined. For example, each of the first to fourth modifications may be combined with the fifth modification. For another example, each of the first to third modifications may be combined with the fourth modification. For still another example, each of the first to second modifications may be combined with the third modification.

The combination is not limited to the above-described examples, and each of the modifications may be combined with the above-described embodiments of the present invention or the multiple modifications may be combined therewith.

Although the present invention has been described in detail with reference to the preferred embodiments, the present invention is not limited to the specific embodiments and shall be interpreted by the following claims. Further, it will be apparent that a person having ordinary skill in the art may carry out various deformations and modifications for the embodiments described as above within the scope without departing from the present invention.

The invention claimed is:

1. A reflector comprising:
   an outer wall;
   an inner wall configured to reflect xenon lamp light from a xenon lamp toward an object to be light sintered and include inner side walls and an inner top wall which are spaced apart from the outer wall by a predetermined distance so as to allow cooling water for cooling heat generated by the xenon lamp light to flow; and
   a cooling tube in which cooling water flows while surrounding a xenon lamp,
   wherein a space between the outer wall and the inner wall provides a flow passage for first cooling water to cool the reflector and the cooling tube provides a flow passage for second cooling water to cool the xenon lamp,
   wherein a direction of the second cooling water flowing through the cooling tube and a direction of the first cooling water flowing in the space between the outer wall and the inner wall are different from each other.

2. The reflector of claim 1, wherein the first cooling water cools all of the inner side walls and the inner top wall.

3. The reflector of claim 1, wherein the inner top wall includes:
   a first main curved portion arranged in an upper left side of a position provided with the xenon lamp and formed upwardly convex toward the outer wall; and
   a second main curved portion symmetrical to the first main curved portion rightward around a position provided with the xenon lamp and formed upwardly convex toward the outer wall.

4. The reflector of claim 1, wherein the inner top wall includes a reflective surface that reflects the xenon lamp light from the xenon lamp toward the object to be light sintered, and a cooling surface that provides a surface on which the cooling water flows, wherein
   the reflective surface has a shape upwardly convex to both sides from a vertically upward site from the xenon lamp, and the cooling surface has a shape corresponding to a shape of the reflective surface.

5. The reflector of claim 4, wherein the shape of the cooling surface corresponds to the shape of the reflective surface upwardly convex to the both sides, so that a weight due to the cooling water is supported by the upward convex shape of the cooling surface.

6. The reflector of claim 4, wherein the cooling surface has a concavo-convex structure extending from an inlet for introducing the first cooling water to an outlet for discharging the first cooling water.

7. The reflector of claim 1, further comprising:
   at least one cooling water inlet formed in the outer wall facing one side of the inner side wall to introduce the first cooling water;
   at least one cooling water outlet formed in the outer wall facing the other side of the inner side wall to discharge the first cooling water; and
   an additional cooling water outlet provided in the outer wall of a region having a cooling passage area larger than a cooling passage area on a cooling water inlet side or a cooling passage area on a cooling water outlet side.

8. The reflector of claim 1, further comprising:
   at least one cooling water inlet formed in the outer wall facing a top side of the inner top wall to introduce the first cooling water;
   at least one cooling water outlet formed in the outer wall facing one side of the inner side wall to discharge the first cooling water; and
   an additional cooling water outlet provided in the outer wall of a region having a cooling passage area larger than a cooling passage area on a cooling water inlet side or a cooling passage area on a cooling water outlet side.

9. The reflector of claim 1, further comprising:
   at least one cooling water inlet formed in the outer wall facing a top side of the inner top wall to introduce the first cooling water; and
   a spray plate extending in a lengthwise direction of the xenon lamp, wherein
   the spray plate includes a plurality of spray ports, and the spray ports have openings gradually larger in size as the openings are away from the cooling water inlet.

10. The reflector of claim 4, wherein the cooling surface is provided with a heat transfer pad for filling a valley between upwardly convex sites from a vertically upward site from the xenon lamp.

11. A light sintering apparatus comprising:
    a xenon lamp; and
    a reflector having an outer wall and an inner wall configured to reflect xenon lamp light from the xenon lamp toward an object to be light sintered, and include inner side walls and an inner top wall which are spaced apart from the outer wall by a predetermined distance so as to allow cooling water for cooling heat generated by the xenon lamp light to flow; and
    a cooling tube in which cooling water flows while surrounding a xenon lamp,
    wherein a space between the outer wall and the inner wall provides a flow passage for first cooling water to cool the reflector and the cooling tube provides a flow passage for second cooling water to cool the xenon lamp,
    wherein a direction of the second cooling water flowing through the cooling tube and a direction of the first cooling water flowing in the space between the outer wall and the inner wall are different from each other.

12. The light sintering apparatus of claim 11, wherein at least a part of the inner side walls of the reflector has a thickness same as at least a part of the inner top wall.

* * * * *